(12) United States Patent
Kwon et al.

(10) Patent No.: US 7,777,323 B2
(45) Date of Patent: Aug. 17, 2010

(54) SEMICONDUCTOR STRUCTURE AND METHOD FOR FORMING THE SAME

(75) Inventors: Yong Chai Kwon, Suwon (KR); Keum-Hee Ma, Andong (KR); Kang-Wook Lee, Suwon (KR); Dong-Ho Lee, Seongnam (KR); Seong-il Han, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 424 days.

(21) Appl. No.: 11/750,663

(22) Filed: May 18, 2007

(65) Prior Publication Data

US 2007/0284729 A1  Dec. 13, 2007

(30) Foreign Application Priority Data

May 22, 2006 (KR) .................. 10-2006-0045801

(51) Int. Cl.
  *H01L 23/12* (2006.01)
  *H01L 21/44* (2006.01)
(52) U.S. Cl. .............. 257/686; 257/775; 257/777; 257/E21.585; 257/E21.587; 438/639; 438/667; 438/675
(58) Field of Classification Search ............... 257/686, 257/777, E21.585, E21.587; 439/639, 667, 439/675
  See application file for complete search history.

(56) References Cited

U.S. PATENT DOCUMENTS

| | | | | |
|---|---|---|---|---|
| 5,532,519 A | * | 7/1996 | Bertin et al. ............. | 257/777 |
| 5,608,264 A | * | 3/1997 | Gaul ....................... | 257/734 |
| 5,618,752 A | * | 4/1997 | Gaul ....................... | 438/626 |
| 5,872,025 A | * | 2/1999 | Cronin et al. ............ | 438/109 |
| 6,049,467 A | * | 4/2000 | Tamarkin et al. ........ | 361/790 |
| 6,362,529 B1 | * | 3/2002 | Sumikawa et al. ...... | 257/777 |
| 6,458,696 B1 | * | 10/2002 | Gross ..................... | 438/668 |
| 6,476,476 B1 | * | 11/2002 | Glenn .................... | 257/686 |
| 6,566,232 B1 | * | 5/2003 | Hara et al. .............. | 438/455 |
| 6,583,030 B1 | * | 6/2003 | Grassl .................... | 438/459 |
| 6,731,514 B2 | * | 5/2004 | Evans ..................... | 361/790 |
| 6,809,421 B1 | * | 10/2004 | Hayasaka et al. ....... | 257/777 |
| 6,916,725 B2 | * | 7/2005 | Yamaguchi ............. | 438/459 |
| 7,122,457 B2 | * | 10/2006 | Tanida et al. ............ | 438/612 |
| 7,135,762 B2 | * | 11/2006 | Yamaguchi ............. | 257/686 |
| 7,138,710 B2 | * | 11/2006 | Fukazawa ............... | 257/686 |
| 7,176,128 B2 | * | 2/2007 | Ahrens et al. ........... | 438/643 |
| 7,199,050 B2 | * | 4/2007 | Hiatt ...................... | 438/667 |
| 7,259,454 B2 | * | 8/2007 | Tanida et al. ............ | 257/686 |
| 7,276,799 B2 | * | 10/2007 | Lee et al. ................ | 257/777 |
| 7,300,857 B2 | * | 11/2007 | Akram et al. ........... | 438/459 |
| 7,339,273 B2 | * | 3/2008 | Kameyama et al. ..... | 257/774 |

(Continued)

FOREIGN PATENT DOCUMENTS

JP  2001-127240  5/2001

(Continued)

*Primary Examiner*—Leonardo Andújar
*Assistant Examiner*—William Harriston
(74) *Attorney, Agent, or Firm*—Harness, Dickey & Pierce, P.L.C.

(57) ABSTRACT

Example embodiments are directed to a method of forming a semiconductor structure and a semiconductor structure including a semiconductor unit including a protrusion on a front side of the semiconductor unit and a recess on a backside of the semiconductor unit.

22 Claims, 13 Drawing Sheets

U.S. PATENT DOCUMENTS

| | | | |
|---|---|---|---|
| 7,387,949 B2 * | 6/2008 | Fukazawa | 438/460 |
| 7,517,798 B2 * | 4/2009 | Tuttle | 438/667 |
| 2004/0048468 A1 * | 3/2004 | Liu et al. | 438/687 |
| 2004/0238927 A1 * | 12/2004 | Miyazawa | 257/678 |
| 2004/0245623 A1 * | 12/2004 | Hara et al. | 257/698 |
| 2005/0009329 A1 * | 1/2005 | Tanida et al. | 438/667 |
| 2005/0029630 A1 * | 2/2005 | Matsuo | 257/628 |
| 2005/0046002 A1 * | 3/2005 | Lee et al. | 257/678 |
| 2005/0151228 A1 * | 7/2005 | Tanida et al. | 257/620 |
| 2005/0230804 A1 * | 10/2005 | Tanida et al. | 257/690 |
| 2006/0003579 A1 * | 1/2006 | Sir | 438/639 |
| 2006/0038300 A1 * | 2/2006 | Tanida et al. | 257/773 |
| 2006/0043535 A1 * | 3/2006 | Hiatt | 257/621 |
| 2006/0043599 A1 * | 3/2006 | Akram et al. | 257/774 |
| 2006/0084258 A1 * | 4/2006 | Nemoto et al. | 438/611 |
| 2007/0045780 A1 * | 3/2007 | Akram et al. | 257/621 |
| 2007/0048969 A1 * | 3/2007 | Kwon et al. | 438/455 |
| 2007/0080457 A1 * | 4/2007 | Tanida et al. | 257/739 |
| 2008/0150089 A1 * | 6/2008 | Kwon et al. | 257/621 |
| 2008/0258267 A1 * | 10/2008 | Nakashima | 257/621 |

FOREIGN PATENT DOCUMENTS

| | | |
|---|---|---|
| JP | 2003-282816 | 10/2003 |
| JP | 2004-221347 | 8/2004 |
| JP | 2005/167093 | 6/2005 |
| JP | 2005-277059 | 10/2005 |
| KR | 10-2005-0054479 | 6/2005 |

* cited by examiner

Back-lap

SEMICONDUCTOR STRUCTURE AND METHOD FOR FORMING THE SAME

PRIORITY STATEMENT

This application claims priority under 35 U.S.C. §119 to Korean Patent Application No. 10-2006-45801 filed on May 22, 2006, the contents of which are herein incorporated by reference in their entirety for all purposes.

BACKGROUND

1. Field

Example embodiments relate to semiconductor structures and methods for manufacturing semiconductor structures.

2. Description of the Related Art

There are many different types of three-dimensional (3D) bonding technologies. These may generally be grouped into three categories. For packages, a wafer may be divided into chips which are then stacked and packaged to form a multi-stacked package. For chips, a wafer may be formed with or without vias, which is then diced into chips and stacked to form a multi-chip package (MCP) or a 3D chip stack package (CSP). For wafers, two or more wafers may be formed with or without vias, stacked, and diced to form a wafer-level 3D chip stack package (WL-3D CSP).

There are advantages and disadvantages of wafer-level 3D bonding at various levels. At the package level and the chip level, advantages may include extendability to current technology, ease of integrating different processes or materials, short-term development, and/or little or no yield loss.

At the wafer level, advantages may include higher performance, higher density, shorter vertical interconnections, and/or lower cost to achieve WL-CSP and/or real chip size.

Conventional techniques for achieving wafer-level 3D bonding may include i) through via formation technology, which may further include via machining and/or void-free via filling, ii) wafer thinning (for example, to ~50 um), iii) high-accuracy uniform bonding, and/or iv) micro-gap filling technology. The location of each of these technologies is illustrated in FIG. 1.

There are also fabrication challenges for stacked wafers. These may include i) alignment, where better than 1 μm accuracy may be needed and alignment accuracy affected by bow/stress build-up, ii) bonding including bonding strength and defects, adhesive properties and thickness variation control, and/or lower temperature bonding, iii) thinning including thinning uniformity for etch-stop and edge cracking and loss, and iv) higher aspect-ratio through via formation including through via etch using, for example, plasma or laser, via fill including enhanced plasma (EP) or chemical vapor deposition (CVD), and via cleaning.

FIG. 2 illustrates a conventional protruding-type 3d stack structure. As shown, an electrode that protrudes from the surface of a chip and a bonding pad are joined in conventional chip stacking. In such an arrangement, i) there is a risk of a joining defect, which may decrease bonding reliability, ii) stack height increases by as much as a portion of the electrode that protrudes from the surface of a chip, and iii) flux is needed to form such a stack.

FIGS. 3a-3d illustrate a conventional process of forming a conventional protruding-type electrode. As shown in FIG. 3a, the electrode 2 may be formed in a substrate 1 surrounded by an isolation layer 3, which is then backlapped, as shown in FIG. 3b. In FIG. 3c, the substrate 1 is etched away, for example, by spin wet etching, to expose a portion of the isolation layer 3. In FIG. 3d, the isolation layer 3 is etched away, for example, also by spin wet etching, to expose a portion of the electrode 2. A shown in FIG. 3d, the electrode 2 protrudes from the chip.

SUMMARY

Example embodiments are directed to a semiconductor structure including a semiconductor unit including a protrusion on a front side of the semiconductor unit and a recess on a backside of the semiconductor unit.

In example embodiments, the semiconductor unit may include a semiconductor chip having the recess.

In example embodiments, the semiconductor chip may further includes a filling pattern and a sidewall structure, including an unexposed sidewall structure, adjacent to the filling pattern and an exposed sidewall structure, adjacent to the recess.

In example embodiments, the exposed sidewall structure may include an insulating layer, at least a first outer metal layer and a second metal layer, wherein an extent of oxidation of the first outer metal layer may be greater than an extent of oxidation of the second metal layer and the extent of oxidation of the second metal layer may be less than an extent of oxidation of the filling pattern.

In example embodiments, the first outer metal layer may be made of a material selected from the group consisting of Ti, TiN, Ta, TaN, W, WN, and TiW, the second metal layer may be made of a material selected from the group consisting of Au or Pd, and the filling pattern may be made of a material selected from the group consisting of Cu.

In example embodiments, the unexposed sidewall structure adjacent to the filling pattern may include an insulating layer, at least a first outer metal layer a second metal layer, and a first inner metal layer, wherein an extent of oxidation of the first outer metal layer may be greater than an extent of oxidation of the second metal layer and the extent of oxidation of the second metal layer may be less than an extent of oxidation of the first inner metal layer.

In example embodiments, the first outer metal layer may be made of a material selected from the group consisting of Ti, TiN, Ta, TaN, W, WN, and TiW, the second metal layer may be made of a material selected from the group consisting of Au or Pd, the first inner metal layer may be made of a material selected from the group consisting of Ti, TiN, Ta, TaN, W, WN, and TiW, and the filling pattern may be made of a material selected from the group consisting of Cu.

In example embodiments, a width of the protrusion may be less than or equal to a width of the recess.

In example embodiments, the protrusion may be a bonding pad.

In example embodiments, the protrusion may protrude from an adhesive insulating layer.

In example embodiments, the semiconductor structure may further include a protection layer on an upper surface of the semiconductor chip, a socket layer, which may be an extension of and part of the sidewall structure on the protection layer, connected to an I/O pad on an upper surface of the semiconductor chip, and a UBM layer on the filling pattern, the adhesive insulating layer covering the UBM layer and the protection layer and exposing the protrusion.

In example embodiments, the semiconductor structure may be connected to other semiconductor structures via the protrusion or the recess.

Example embodiments may be directed to a package including a plurality of semiconductor structures, connected by their respective protrusions and recesses.

In example embodiments, a package may include an upper semiconductor structure including at least a recess, a lower semiconductor structure including at least a protrusion, the protrusion connected to the recess of the upper semiconductor structure and the recess connected to the protrusion of the lower semiconductor structure.

In example embodiments, a multichip package may include a board including a recess, the recess connected to a protrusion of the upper semiconductor structure and a molding material, attached to the board, the molding material and the board surrounding each of the semiconductor structures.

In example embodiments, the protrusion and sidewalls of the semiconductor unit defining the recess may form an intermetallic bond.

In example embodiments, the intermetallic bond may anchor the semiconductor structure to another semiconductor structure.

In example embodiments, the protrusion may be made of a low melting point metal and the sidewalls of the semiconductor unit defining the recess are made of gold or palladium.

Example embodiments are directed to a method of manufacturing a semiconductor structure including forming a protrusion on a front side of a semiconductor unit and forming a recess on a backside of the semiconductor unit.

In example embodiments, forming the recess may include forming a through via hole in the semiconductor unit, forming a sidewall structure in the through via hole, filling the through via hole partly with a photoresist to cover a portion of the sidewall structure, filling a remainder of the through via hole with a filling pattern, thinning the backside of the semiconductor unit to expose the photoresist, and/or removing the photoresist to form the recess and expose a portion of the sidewall structure.

In example embodiments, forming the sidewall structure may include forming an insulating layer in the through via hole, forming a first outer metal layer on the insulating layer, and/or forming a second metal layer on the first outer metal layer, wherein an extent of oxidation of the first outer metal layer may be greater than an extent of oxidation of the second metal layer and the extent of oxidation of the second metal layer may be less than an extent of oxidation of the filling pattern.

In example embodiments, forming the sidewall structure may include forming an insulating layer in the through via hole, forming a first outer metal layer on the insulating layer, forming a second metal layer on the first outer metal layer, forming a first inner metal layer on the second metal layer, wherein an extent of oxidation of the first outer metal layer may be greater than an extent of oxidation of the second metal layer and the extent of oxidation of the second metal layer may be less than an extent of oxidation of the first inner metal layer.

In example embodiments, forming the protrusion may include forming a main plug pattern on the sidewall structure, forming a subsidiary plug pattern on the main plug pattern, exposing a portion of the subsidiary plug pattern to form the protrusion.

Example embodiments are directed to a method of manufacturing a semiconductor structure including forming a through via hole in a semiconductor unit, forming a socket layer on a front side of the semiconductor unit and a sidewall structure in the through via, filling the through via hole partly with a photoresist to cover a portion of the sidewall structure, filling a remainder of the through via hole with a filling material to cover a remainder of the sidewall structure, forming a main plug pattern on the socket layer, forming a subsidiary plug pattern on the main plug pattern, exposing a portion of the subsidiary plug pattern to form a protrusion, attaching a support layer to the front side of the semiconductor unit, thinning a backside of the semiconductor unit to expose the photoresist, removing the photoresist to form a recess, and/or detaching the support layer from the front side of the semiconductor unit.

In example embodiments, the method may further include attaching the semiconductor unit to another semiconductor unit via the protrusion or the recess.

In example embodiments, the another semiconductor unit may be a board, the method further including connecting the protrusion of the semiconductor unit to a recess of the board.

Example embodiments are directed to a method of forming a recess in a semiconductor unit including forming a through via hole in the semiconductor unit, forming a sidewall structure in the through via, filling the through via hole partly with a photoresist to cover a portion of the sidewall structure, filling a remainder of the through via hole with a filling pattern, thinning the backside of the semiconductor unit to expose the photoresist, and/or removing the photoresist to form the recess and expose a portion of the sidewall structure.

In example embodiments, forming the sidewall structure may include forming an insulating layer in the through via, forming a first outer metal layer on the insulating layer, and/or forming a second metal layer on the first outer metal layer, wherein an extent of oxidation of the first outer metal layer may be greater than an extent of oxidation of the second metal layer and the extent of oxidation of the second metal layer may be less than an extent of oxidation of the filling pattern.

In example embodiments, forming the sidewall structure may include forming an insulating layer in the through via, forming a first outer metal layer on the insulating layer, forming a second metal layer on the first outer metal layer, and forming a first inner metal layer on the second metal layer, wherein an extent of oxidation of the first outer metal layer may be greater than an extent of oxidation of the second metal layer and the extent of oxidation of the second metal layer may be less than an extent of oxidation of the first inner metal layer.

BRIEF DESCRIPTION OF THE DRAWINGS

The above and other features and advantages of example embodiments will become more apparent by describing them in detailed with reference to the accompanying drawings.

DETAILED DESCRIPTION

Figure 1:
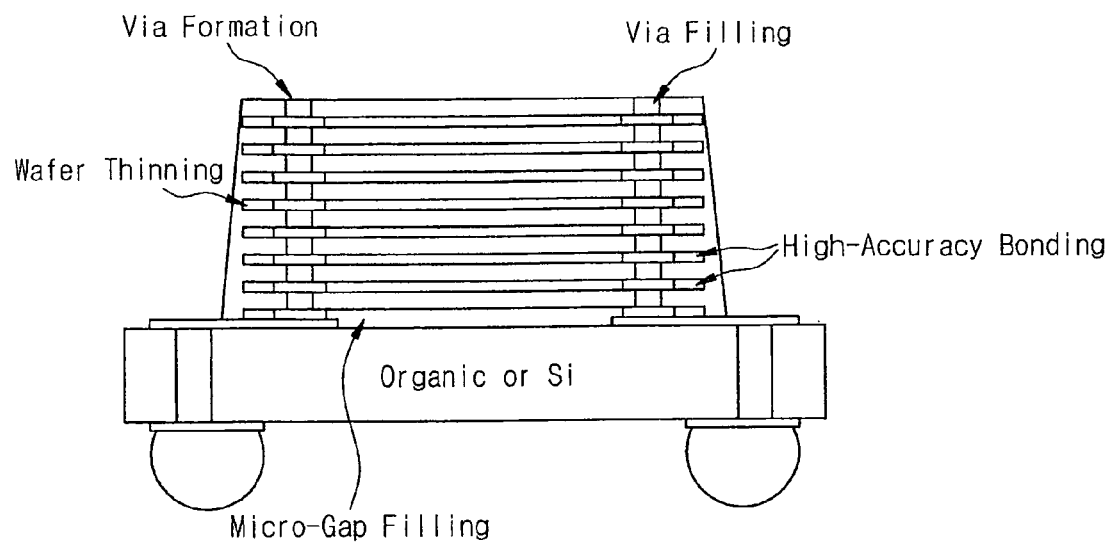
FIG. 1 illustrates conventional techniques for achieving wafer-level 3D bonding.
Figure 2:
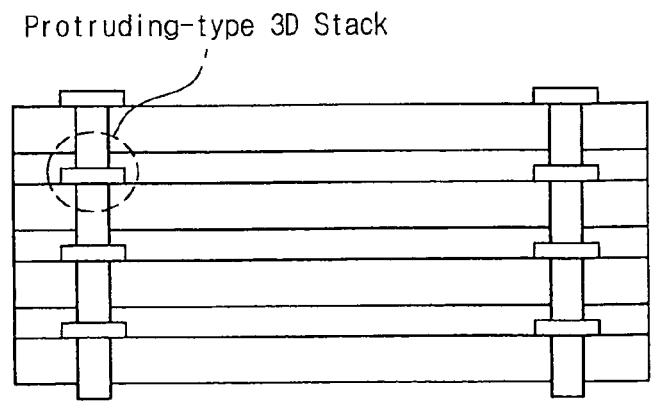
FIG. 2 illustrates a conventional protruding-type 3d stack structure.
Figure 3A:
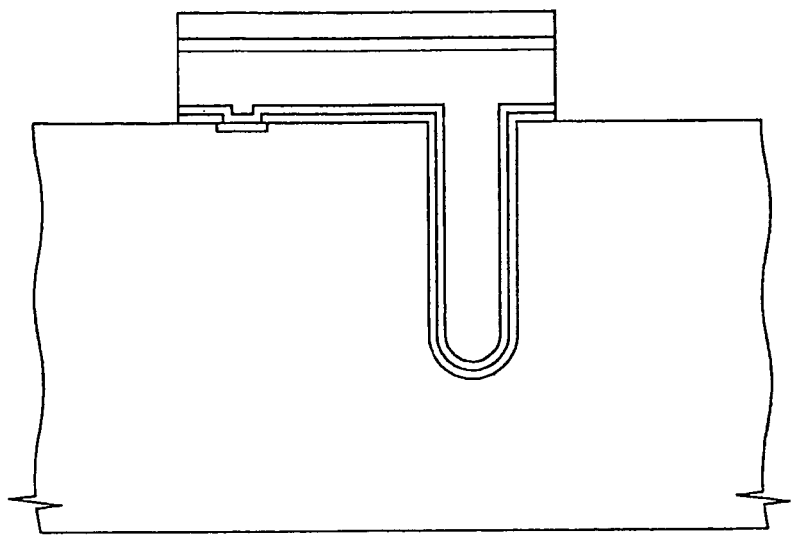
FIGS. 3a-3d illustrate a conventional process of forming a conventional protruding-type electrode.
Figure 3B:
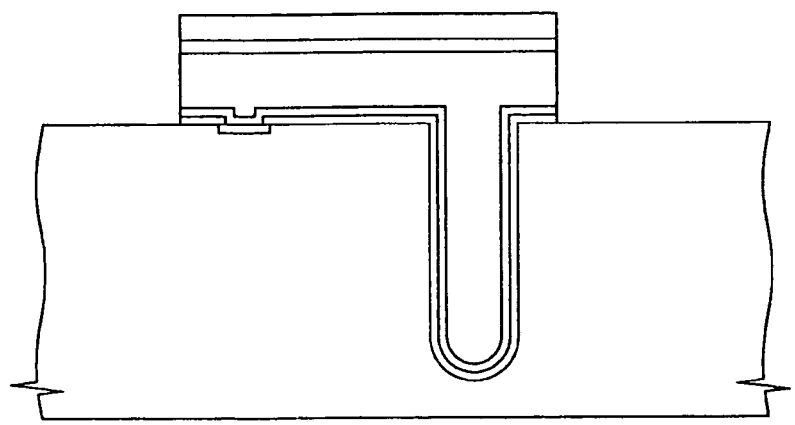
Figure 3C:
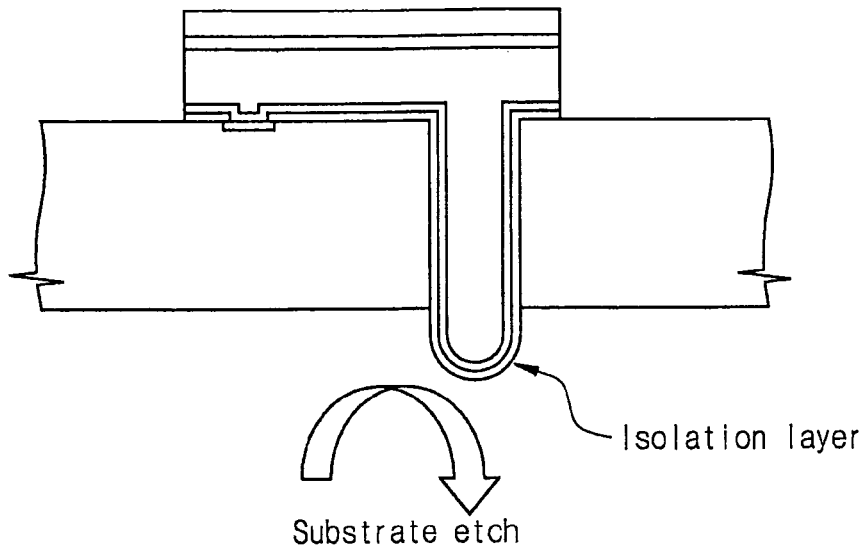
Figure 3D:
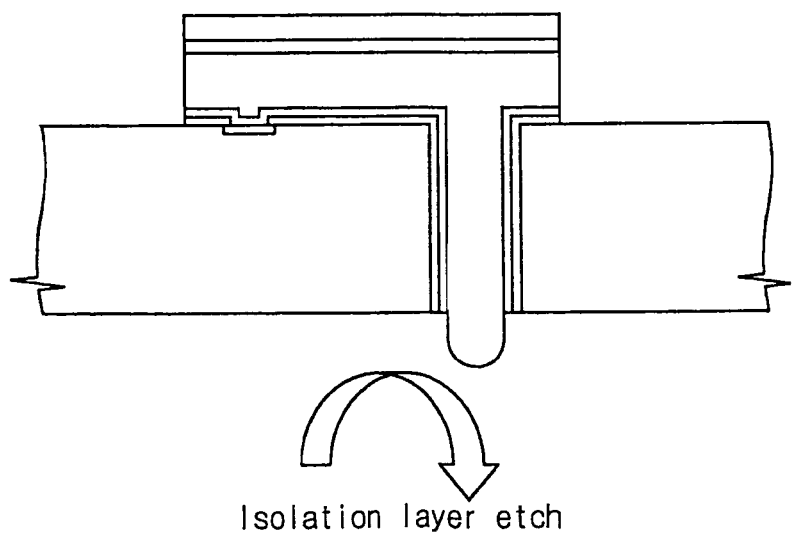

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

Figure 4:
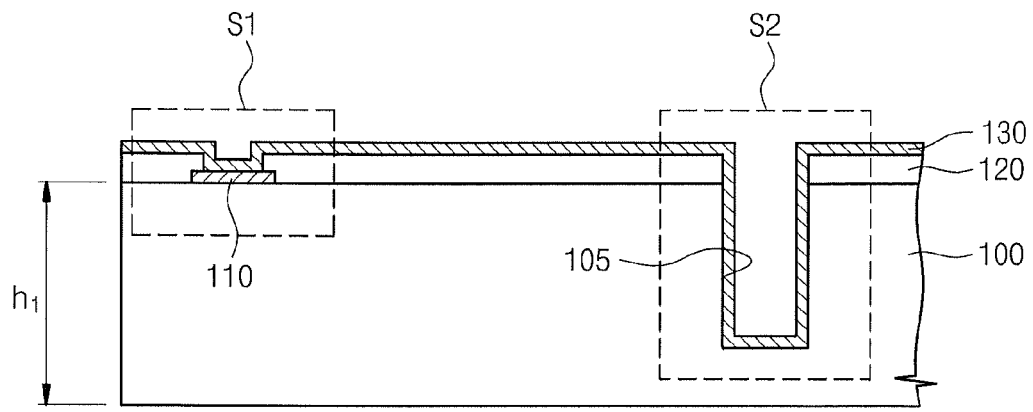
FIG. 4 illustrates a cross-sectional view of a semiconductor device according to example embodiments.

FIG. 4 illustrates a cross-sectional view of a semiconductor device 300 according to example embodiments. As illustrated in FIG. 4, the semiconductor device 300 may include a substrate 100, one or more I/O pads 110, one or more through-vias 105, a protection layer 120, and/or a socket layer 130. Area S1 illustrates an example I/O pad 110 and area S2 illustrates an example through-via 105.

Figure 5:
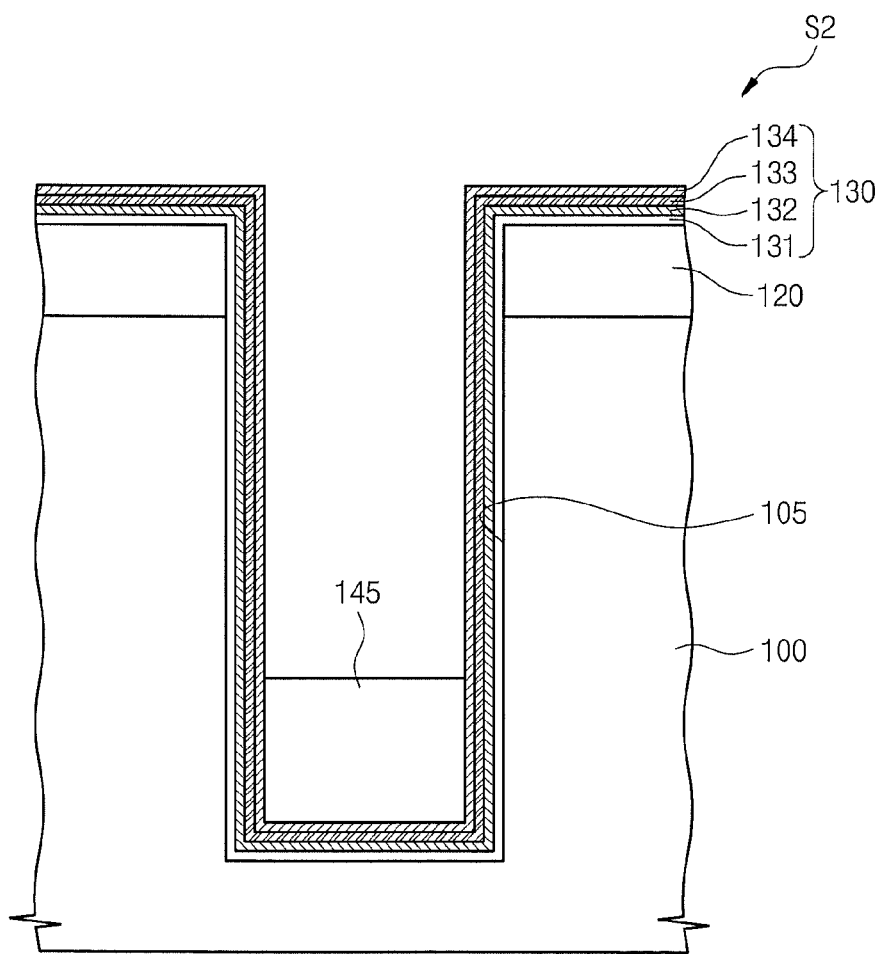
FIG. 5 illustrates a cross-sectional view of a semiconductor device according to example embodiments in more detail.

FIG. 5 illustrates the area S2 of an example through-via 105 in more detail. As shown in FIG. 5, the socket layer 130 may include an insulating layer 131, a first outer metal layer 132, an oxidation-preventing metal layer (which also may be referred to as a second metal layer) 133, and/or a first inner metal layer 134. In example embodiments, the insulating layer 131 may reduce or prevent the possibility of an electrical short between the semiconductor device 300 and the first outer metal layer 132 and/or the oxidation-preventing metal layer 133.

In example embodiments, the first outer metal layer 132 may reduce or prevent impurities from diffusing throughout the semiconductor device 300. The first outer metal layer 132 may also enhance the bonding ability between the insulating layer 131 and the oxidation-preventing metal layer 133. In example embodiments, the first outer metal layer 132 may be made of a material selected from the group consisting of Ti, TiN, Ta, TaN, W, WN, TiW, and combinations thereof.

In example embodiments, the oxidation-preventing metal layer 133 may be made of metal whose degree (or extent) of oxidation is lower than that of the first outer and/or first inner metal layers 132, 134. In example embodiments, the oxidation-preventing metal layer 133 may be made of metal whose degree (or extent) of oxidation is lower than that of one or more main plug patterns, to be discussed below. In example embodiments, the oxidation-preventing metal layer 133 may be made of Au or Pd or mixtures thereof.

In example embodiments, the first inner metal layer 134 may act as a seed electrode for electroplating (for example, Cu electroplating). In example embodiments, the first inner metal layer 134 may also enhance the bonding ability between the oxidation-preventing metal layer 133 and one or more main plug patterns, to be discussed below.

In example embodiments, the first inner metal layer 134 is made of a material selected from the group consisting of Ti, TiN, Ta, TaN, W, WN, TiW, and mixtures thereof.

Figure 6:
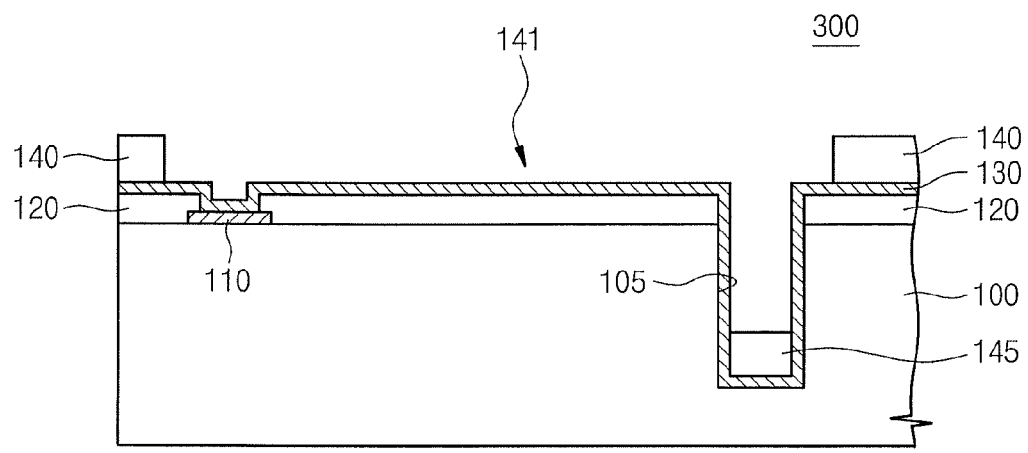
FIGS. 6-13 illustrate a method of manufacturing a semiconductor structure according to example embodiments.

As shown in FIG. 6, a first molding pattern 140 may be formed on all or a portion of the socket layer 130. In example embodiments where the first molding pattern 140 is formed on a portion of the socket layer 130, an uncovered area 141 is also formed (in which one or more main plug patterns may be formed, as discussed below). In example embodiments, a sacrificial pattern 145 (also shown in FIG. 5) may be formed in all or part of the through via 105. In example embodiments, the first molding pattern 140 and the sacrificial pattern 145 may be simultaneously formed and/or formed of the same material.

Figure 7:
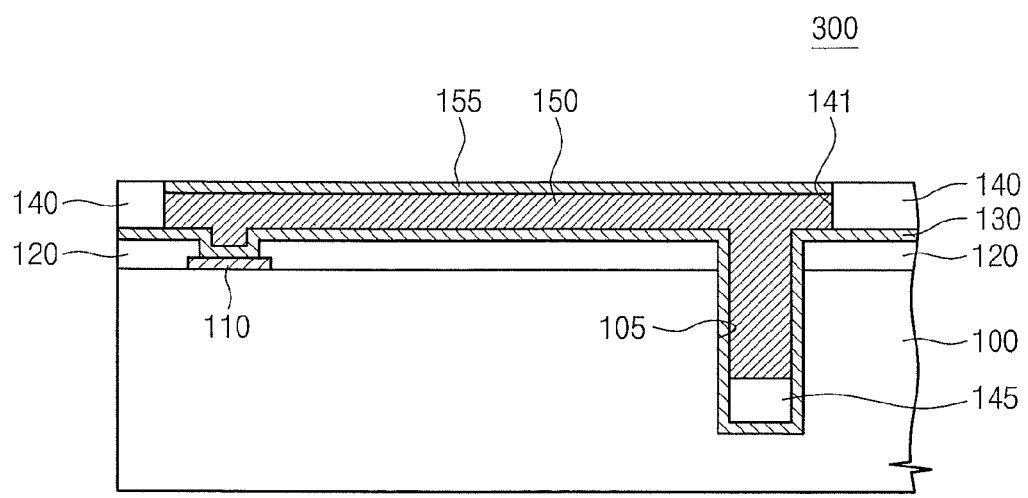

As illustrated in FIG. 7, one or more main plug patterns 150 may be formed on one or both of the socket layer 130 and the sacrificial pattern 145. In example embodiments, an underbump metallization (UBM) layer 155 may be formed on the main plug pattern 150. In example embodiments, the UBM layer 155 may enhance the bonding ability between the main plug pattern 150 and subsidiary plug patterns that will be discussed in more detail below.

In alternative embodiments, the first molding pattern 140 need not be formed, rather, the socket layer 130 may be patterned only in the desired locations.

Figure 8:
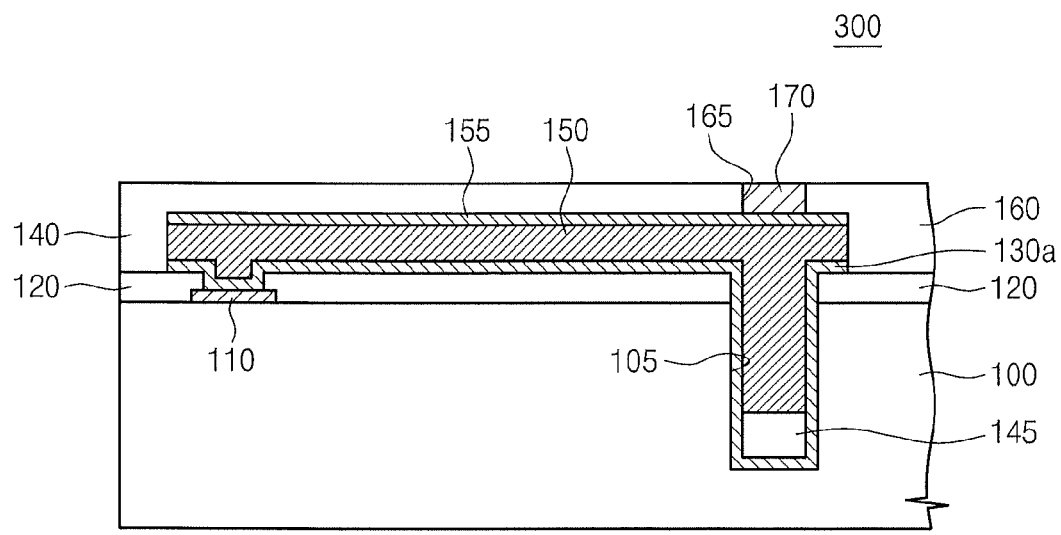

In other example embodiments, as illustrated in FIG. 8, a socket layer 130a may be formed and patterned prior to forming the first molding pattern 140. As shown in FIG. 8, at one or more end portions of the semiconductor device 300, the socket layer 130a may be removed and the first molding pattern 140 formed such that, at one or more end portions of the semiconductor device 300, the protection layer 120 and the first molding pattern 140 may be in direct contact, without the intervening socket layer 130a.

As illustrated in FIG. 8, a second molding pattern 160 may be formed on the socket layer 130 and subsidiary plug patterns 170 may be formed in a cavity 165 between the first molding pattern 140 and the second molding pattern 160. The subsidiary plug pattern 170 may be made of a lower melting point metal, for example, a material including tin, for example, Sn, SnPb, SnAg, or SnAgCu or a material including indium. In example embodiments, a portion (for example, an upper portion) or all of the first molding pattern 140 and/or the second molding pattern 160 may be removed.

Figure 9:
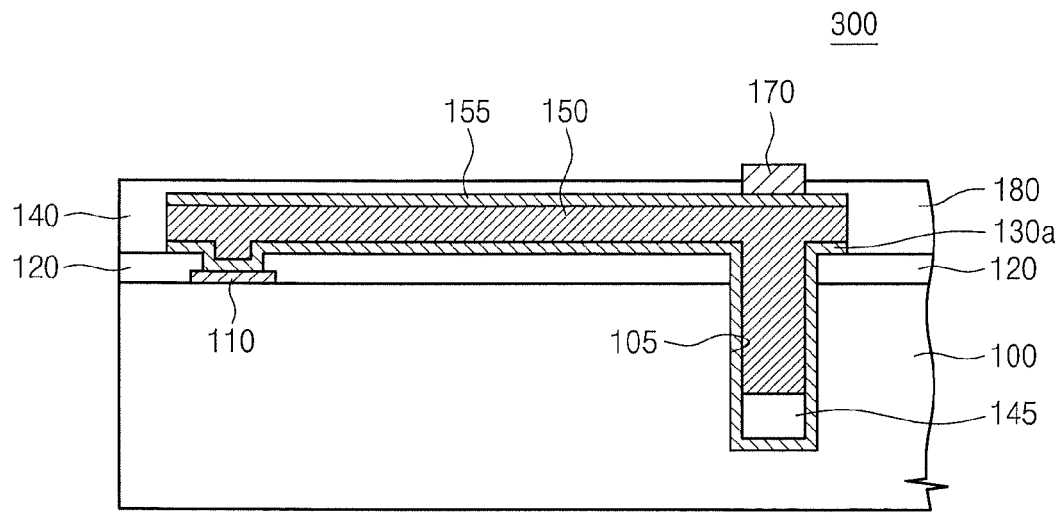

As illustrated in FIG. 9, an adhesive insulating layer 180 may be formed on the protective layer 120. In example embodiments, the UBM layer 155 and the protection layer 120 may be covered by the adhesive insulating layer 180; however, an upper portion of the subsidiary plug pattern 170 may be exposed.

Figure 10:
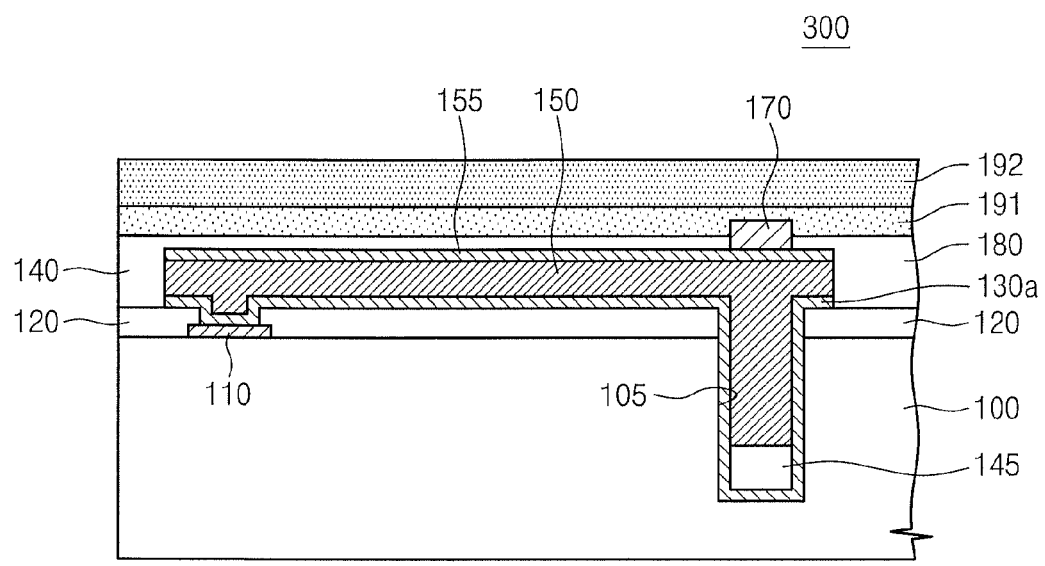

As illustrated in FIG. 10, a temporary adhesive layer 191 may be formed on the first molding pattern 140, the subsidiary plug pattern 170 and/or the adhesive insulating layer 180. A supporting layer 192 may be formed on the temporary adhesive layer 191.

Figure 11:
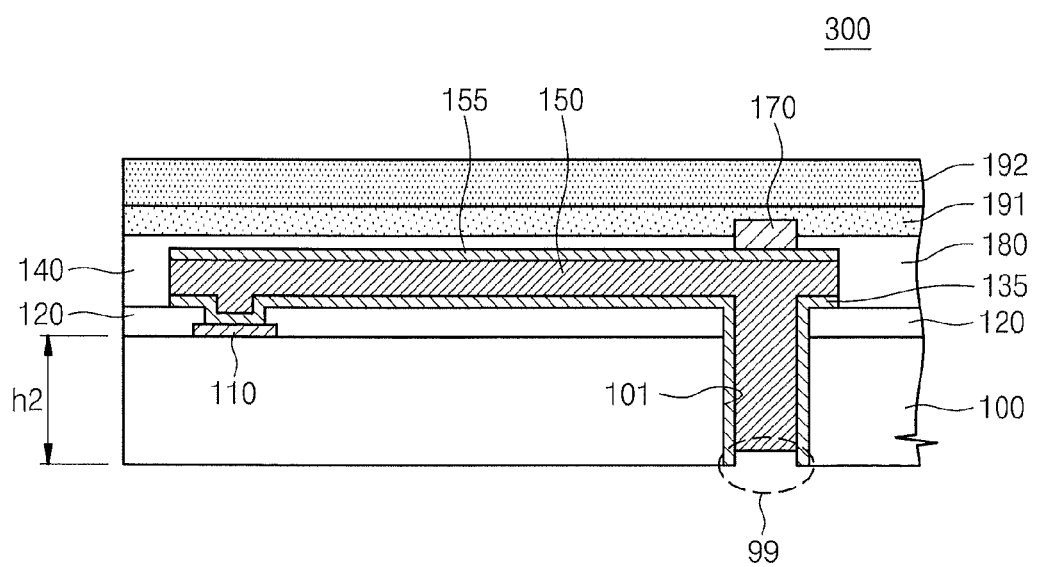

As illustrated in FIG. 11, a lower part or bottom part of the semiconductor substrate 100 may be thinned or removed by back grinding. In addition, the sacrificial pattern 145 may be partially or completely removed in order to form an area 99 (for example, a recess or a concavity) in the through via 105. In example embodiments, the back grinding and/or removal of the sacrificial pattern 145 may expose one or more of the layers 131, 132, 133, and/or 134 of the socket layer 130, as shown in the area 99 in FIG. 11 (also shown in 15 in more detail, as discussed below).

Figure 12:
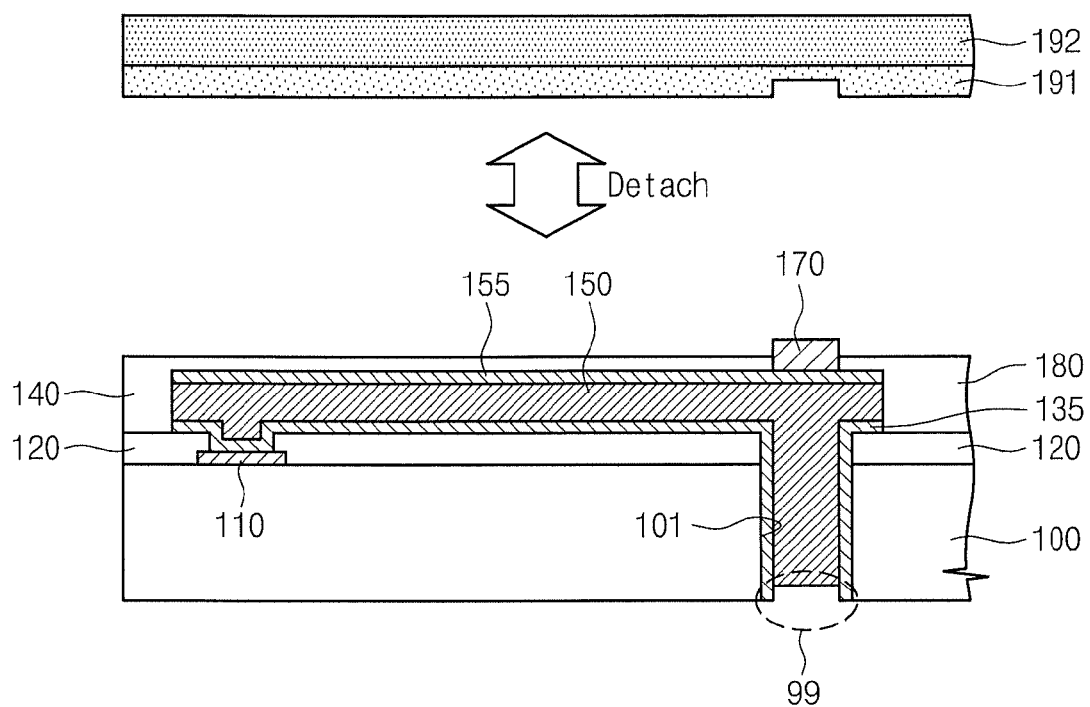

In example embodiments, as illustrated in FIG. 12, the temporary adhesive layer 191 and/or the supporting layer 192 may be removed or detached from the semiconductor device 300. In example embodiments, the temporary adhesive layer 191 and/or the supporting layer 192 may be removed or detached from the semiconductor device 300 before or after the wafer is diced into chips.

Figure 13:
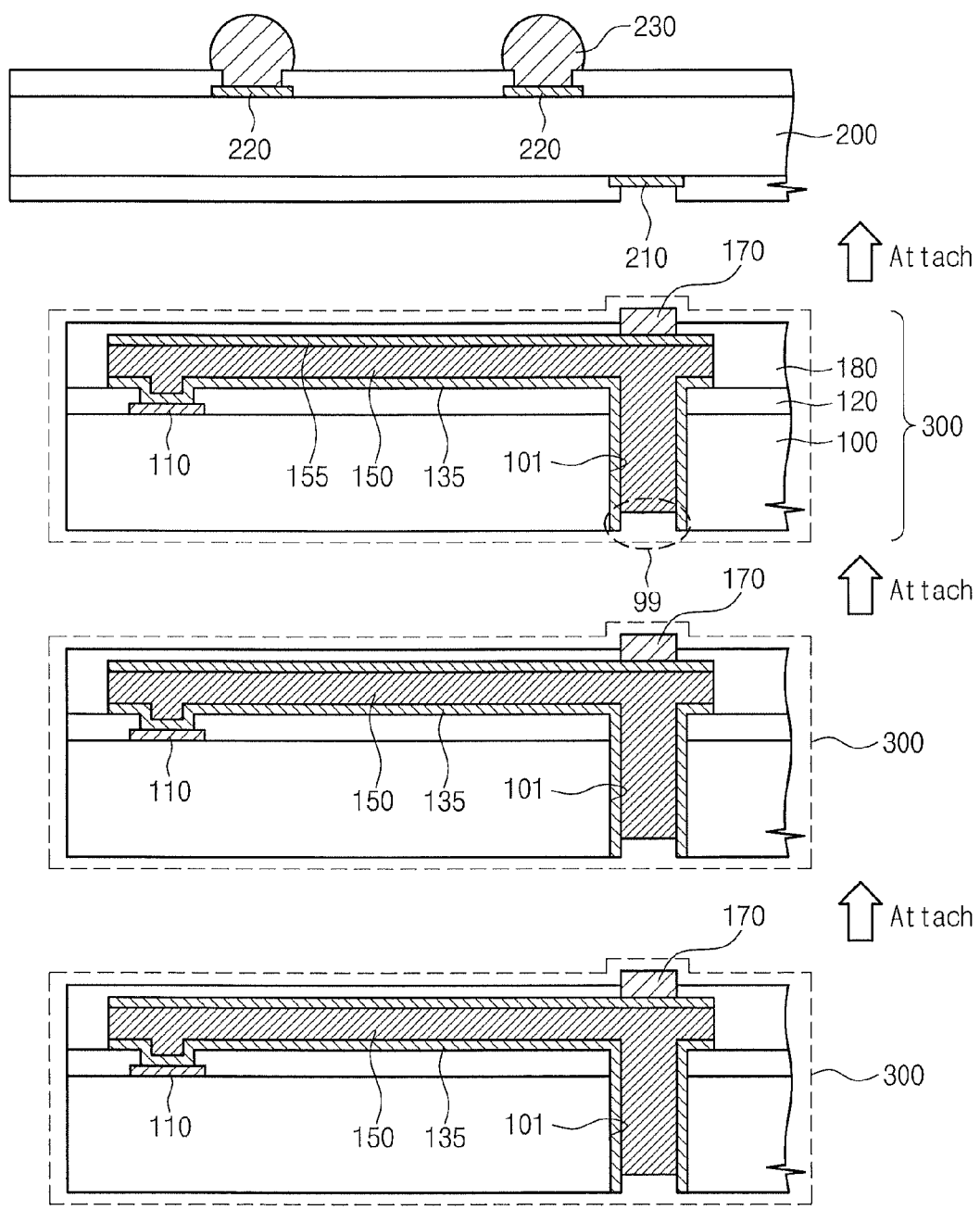

As illustrated in FIG. 13, the semiconductor device 300 may now be attached to another semiconductor device 300 on either side, or a board, for example, a printed circuit board (PCB), as shown in FIG. 13. As shown in FIG. 13, the subsidiary plug pattern 170 may protrude from a front side of the semiconductor device 300 and the area 99 may be formed as a recess on a backside of the semiconductor device 300. Two or more semiconductor devices 300 may be stacked using corresponding ones of the protrusions and recesses. In example embodiments, a width of the protrusion is less than or equal to a width of the recess, so that the protrusion may fit inside the recess.

In example embodiments, the semiconductor device 300 includes a semiconductor chip, and the recess is in the semiconductor chip. In example embodiments, the subsidiary plug pattern 170 forms a bonding pad. In example embodiments, as shown in FIG. 13, the protrusion protrudes from the adhesive insulating layer 180.

Figure 14:
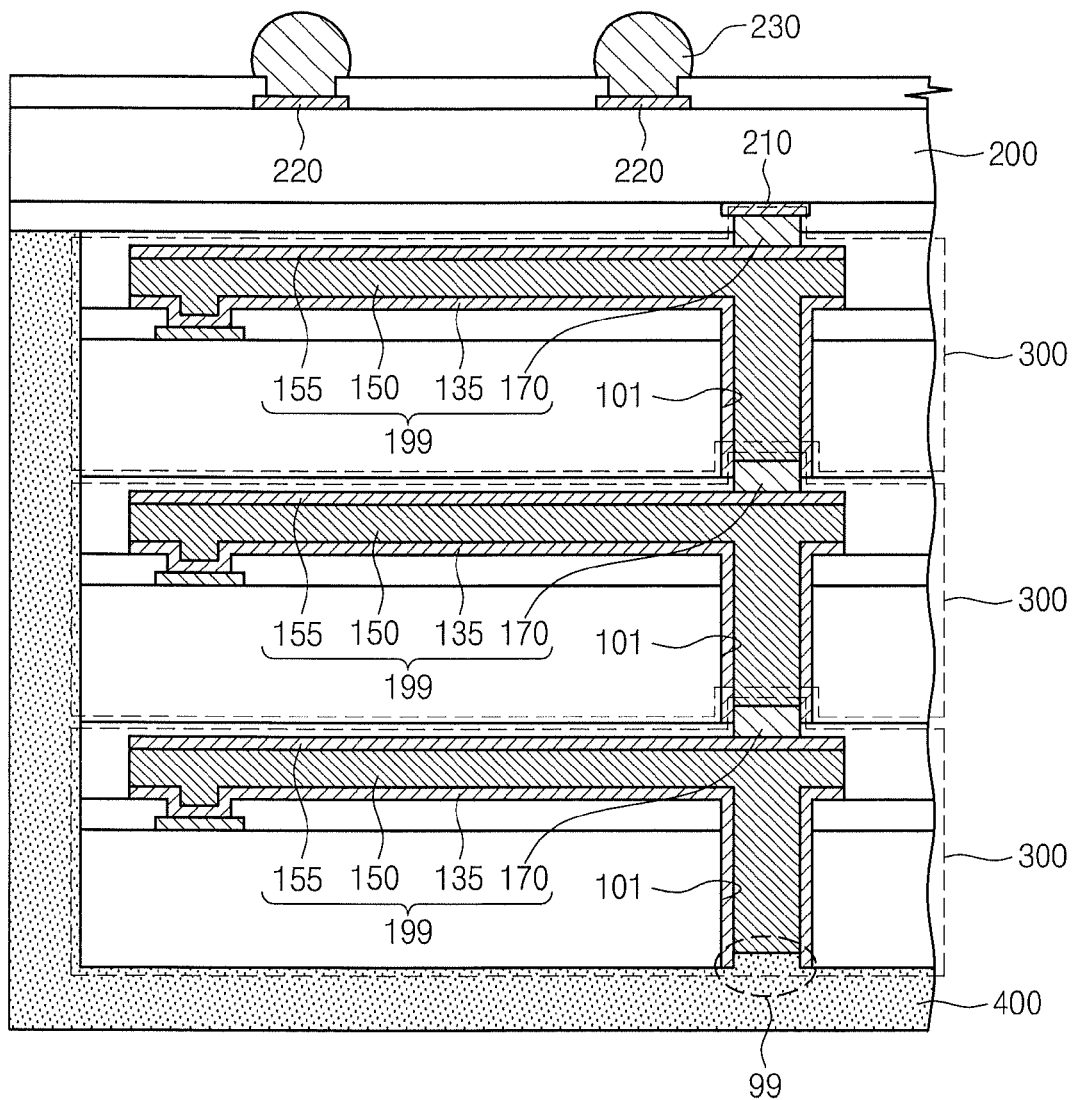
FIG. 14 illustrates a cross-sectional view of a semiconductor package according to example embodiments in more detail.

FIG. 14 illustrates a stack of three semiconductor devices 300 and a PCB 200 including bonding pads 220, and solder balls 230. As illustrated in FIG. 14, the semiconductor devices 300 may be secured together via a connector 400. In example embodiments, the semiconductor devices 300 may be surrounded by a molding material or an encapsulant for further protection.

Figure 15:
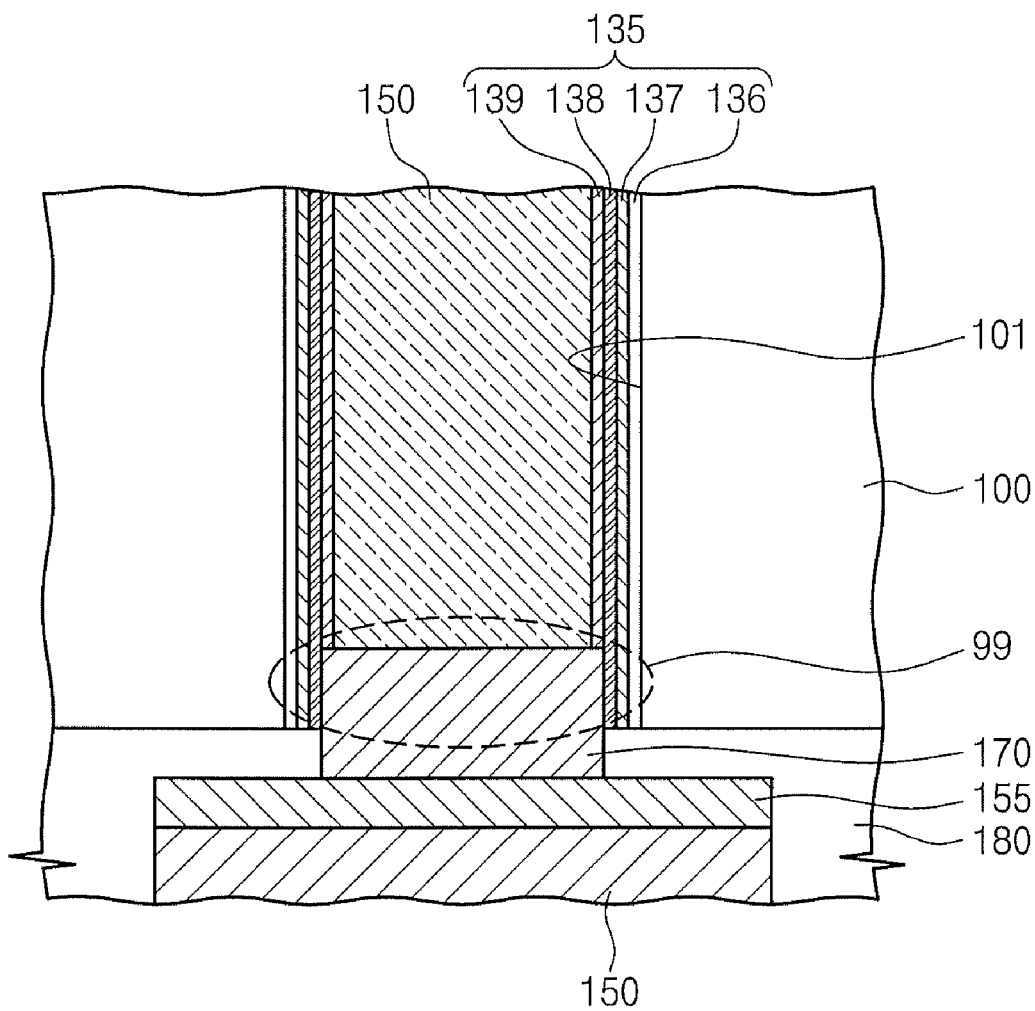
FIG. 15 illustrates a cross-sectional view of a semiconductor device according to example embodiments in more detail.

FIG. 15 illustrates an example embodiment, including area 99, in more detail. As shown in FIG. 15, the socket layer 135 may include an insulating layer 136, a first outer metal layer 137, an oxidation-preventing metal layer (which also may be referred to as a second metal layer) 138, and/or a first inner metal layer 139.

In example embodiments, the one or more main plug patterns 150 may act as a filling pattern to fill a portion of the one or more through-vias 105. In example embodiments, the one or more main plug patterns 150 may be made of Cu or other similar material.

In example embodiments, the semiconductor device 300 may further include a sidewall structure, including an unexposed sidewall structure, and an exposed sidewall structure. In example embodiments, the unexposed sidewall structure may be adjacent to the filling pattern and the exposed sidewall structure may be adjacent to the recess 99.

In example embodiments, the unexposed sidewall structure may include one ore more of the insulating layer 136, the first outer metal layer 137, the oxidation-preventing metal layer 138, and the first inner metal layer 139.

In example embodiments, the exposed sidewall structure may include none of the insulating layer 136, the first outer metal layer 137, the oxidation-preventing metal layer 138, or the first inner metal layer 139 or any subset of the insulating layer 136, the first outer metal layer 137, the oxidation-preventing metal layer 138, and the first inner metal layer 139, but not all of the insulating layer 136, the first outer metal layer 137, the oxidation-preventing metal layer 138, and the first inner metal layer 139.

In example embodiments, the first outer metal layer 137 may reduce or prevent impurities from diffusing throughout the semiconductor device 300. The first outer metal layer 137 may also enhance the bonding ability between the insulating layer 136 and the oxidation-preventing metal layer 138. In example embodiments, the first outer metal layer 137 may be made of a material selected from the group consisting of Ti, TiN, Ta, TaN, W, WN, TiW, and combinations thereof.

In example embodiments, the oxidation-preventing metal layer 138 may be made of metal whose degree (or extent) of oxidation is lower than that of the first and/or second metal layers 137,139. In example embodiments, the oxidation-preventing metal layer 138 may be made of metal whose degree (or extent) of oxidation is lower than that of the one or more main plug patterns/filling patterns 150. In example embodiments, the oxidation-preventing metal layer 138 may be made of Au or Pd or mixtures thereof.

In example embodiments, the first inner metal layer 139 may act as a seed electrode for electroplating (for example, Cu electroplating). In example embodiments, the first inner metal layer 139 may also enhance the bonding ability between the oxidation-preventing metal layer 138 and the one or more main plug patterns 150.

In example embodiments, the first inner metal layer 139 is made of a material selected from the group consisting of Ti, TiN, Ta, TaN, W, WN, TiW, and mixtures thereof.

In example embodiments, an intermetallic bond may be formed between the socket layer 130, 135 and the subsidiary plug pattern/bonding pad 170. Intermetallic compounds may form when two unlike metals diffuse into one another creating species materials which are combinations of the two materials. Intermetallic growth is the result of the diffusion of one material into another via crystal vacancies made available by defects, contamination, impurities, grain boundaries and mechanical stress. The diffusion rate for the first material into the second material and the second material into the first material are usually different. These diffusion rates are a function of temperature. If one material overwhelms the other in volume, and diffusion occurs rapidly enough, the minority material can appear to have been completely "consumed" by the majority material. Diffusion is enabled by the movement of atoms of one material into the crystal vacancies of the other material. The vacancies will appear to be the moving feature and they can tend to coalesce and become visible in the form of voids or pores.

In example embodiment, the protrusion and the semiconductor device may be made any two metals capable of forming an intermetallic bond.

In example embodiment, the protrusion may be made of a lower melting point metal and the sidewalls of the semiconductor device defining the recess may be made of a higher melting point metal.

In example embodiment, the protrusion may be made of aluminum or tin and the sidewalls of the semiconductor device defining the recess may be made of gold or palladium.

In the example embodiment illustrated in FIG. 15, the bonding interface may be primarily between the subsidiary plug pattern (or bonding pad) 170 and the oxidation-preventing metal layer 138.

Figure 16:
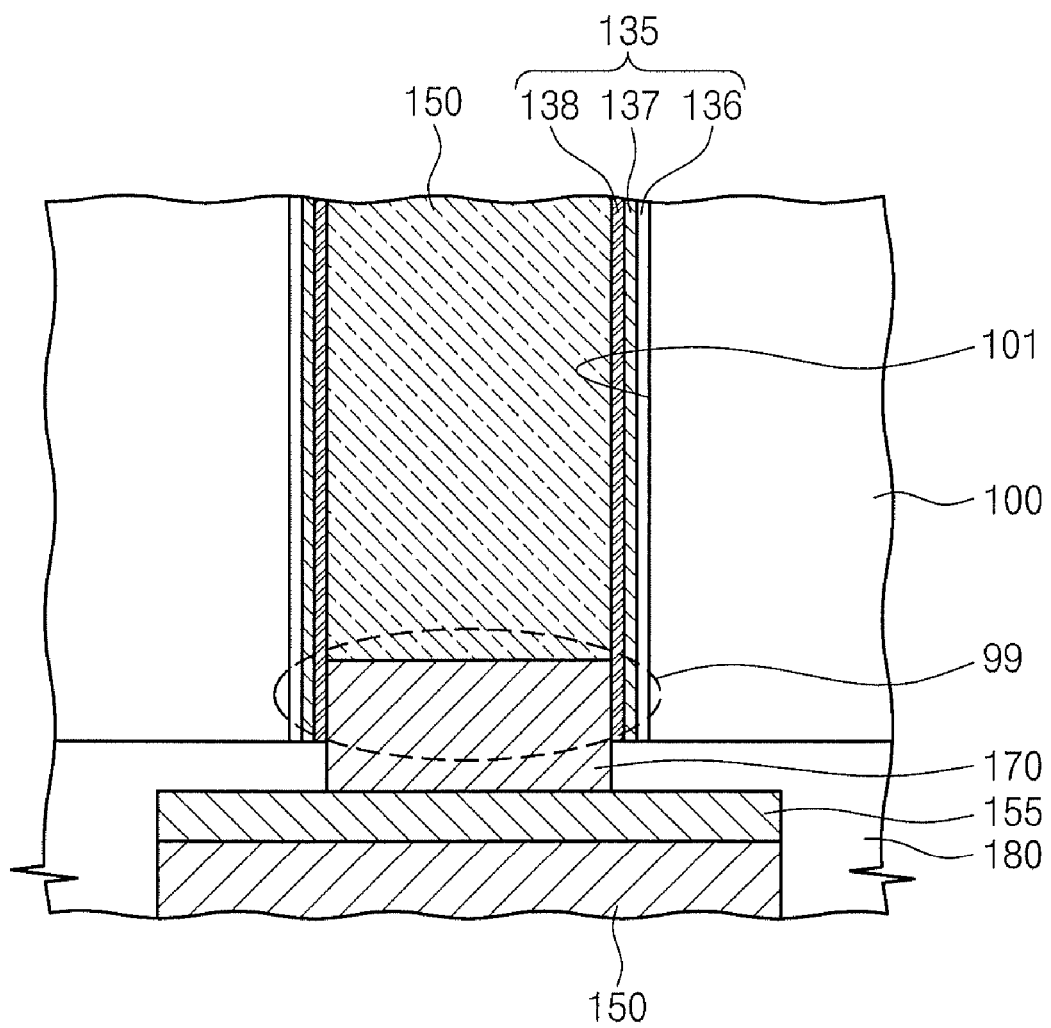
FIG. 16 illustrates a cross-sectional view of a semiconductor device according to example embodiments in more detail.

FIG. 16 illustrates an example embodiment where the socket layer 135 includes the insulating layer 136, the first outer metal layer 137, and the oxidation-preventing metal layer 138, where the first inner metal layer 139 is not present. In the example embodiment illustrated in FIG. 16, the bonding interface may be primarily between the subsidiary plug pattern (or bonding pad) 170 and the oxidation-preventing metal layer 138.

As shown in FIG. 14, the intermetallic bond may anchor a semiconductor device 300 to another semiconductor device 300.

Figure 17A:
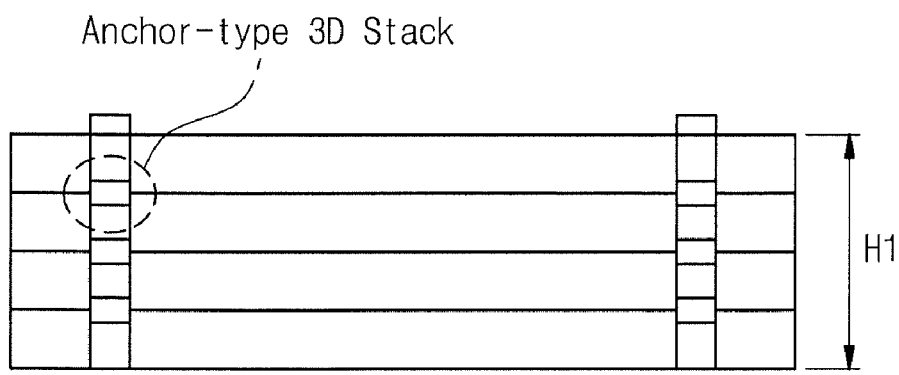
FIG. 17a illustrates a cross-sectional view of a semiconductor package according to example embodiments.

As set forth above, in example embodiments, the one or more main plug patterns/filling patterns 150 do not protrude from the semiconductor device. In example embodiments, the subsidiary plug pattern/bonding pad 170 does protrude and is partially (or completely) within two adjacent semiconductor devices. FIG. 17a illustrates a cross-sectional view of a semiconductor package according to example embodiments. As shown, the semiconductor package according to example embodiments has a height of H1.

Figure 17B:
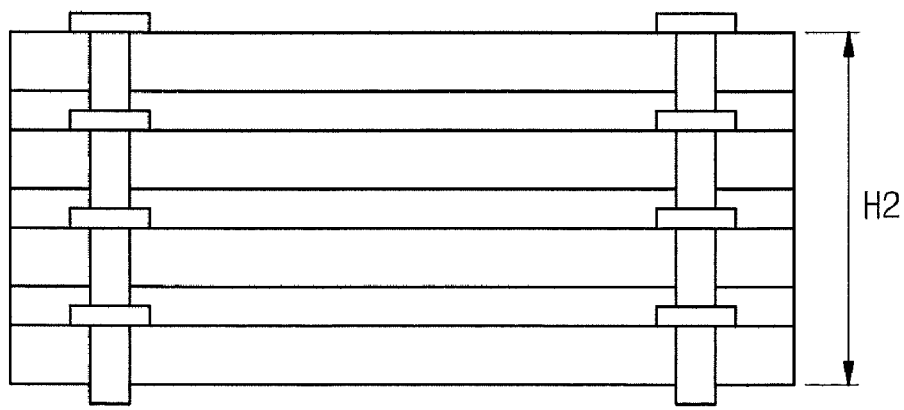
FIG. 17b illustrates a cross-sectional view of a semiconductor package according to the conventional art.

FIG. 17b illustrates a cross-sectional view of a semiconductor package according to the conventional art. As shown, the conventional art semiconductor package has a height of H2, where H2>H1.

Example embodiments discussed above may be implemented at the package level, the chip level or the wafer level. Example embodiments discussed above may be improve alignment, bonding, thinning and/or the via formation. Example embodiments discussed above may obviate the need to use flux.

While example embodiments have been particularly shown and described with reference to the example embodiments shown in the drawings, it will be understood by those of ordinary skill in the art that various changes in form and detail may be made therein without departing from the spirit and scope of the following claims.

What is claimed is:

1. A semiconductor structure, comprising:
   semiconductor chips including at least a penetrating hole therein; and
   connecting structures between the semiconductor chips, each of the connecting structures including a plug pattern in the penetrating hole and a socket pattern between the plug pattern and a sidewall of the penetrating hole,
   wherein the plug pattern includes a main plug pattern and a subsidiary plug pattern, the main plug pattern defining a recess in the socket pattern and the recess encloses the subsidiary plug pattern of an adjacent connecting structure, and an inner wall of the socket pattern is in direct contact with an outer wall of the enclosed subsidiary plug pattern.

2. The semiconductor structure of claim 1, wherein the socket pattern includes
   an oxidation-preventing metal pattern penetrating through the penetrating hole, and
   an insulating pattern between the oxidation-preventing metal pattern and the semiconductor chip,
   wherein the subsidiary plug pattern is in direct contact with the inner wall of the socket pattern at the recess.

3. The semiconductor structure of claim 2, wherein the oxidation-preventing metal pattern is made of at least one of noble metals, and the subsidiary plug pattern is in direct contact with the oxidation-preventing metal pattern.

4. The semiconductor structure of claim 2, further comprising:
   a first metal pattern between the oxidation-preventing metal pattern and the insulating pattern,
   wherein the first metal pattern is made of at least one of titanium, titanium nitride, tantalum, tantalum nitride, tungsten, tungsten nitride, chromium, nickel, tungsten titanium, and alloys thereof.

5. The semiconductor structure of claim 2, further comprising:
   a second metal pattern between the oxidation-preventing metal pattern and the main plug pattern and exposing an inner wall of the oxidation-preventing metal pattern at the recess,
   wherein the second metal pattern is made of at least one of copper, titanium, titanium nitride, tantalum, tantalum nitride, tungsten, tungsten nitride, and tungsten titanium.

6. The semiconductor structure of claim 1, wherein the subsidiary plug pattern is made of one of low melting point metals and solder alloys.

7. The semiconductor structure of claim 1, wherein the recess is completely filled with the subsidiary plug pattern.

8. The semiconductor structure of claim 1, wherein
   a portion of the socket pattern adjacent the outer wall of the enclosed subsidiary plug pattern includes an insulating layer, at least a first outer metal layer, and a second metal layer, and
   an extent of oxidation of the first outer metal layer is greater than an extent of oxidation of the second metal layer and an extent of oxidation of the second metal layer is less than an extent of oxidation of the main plug pattern.

9. The semiconductor structure of claim 8, wherein
the first outer metal layer includes at least one of Ti, TiN, Ta, TaN, W, WN, and TiW,
the second metal layer includes at least one of Au and Pd, and
the main plug pattern includes Cu.

10. The semiconductor structure of claim 8, wherein
a portion of the socket pattern adjacent the main plug includes an insulating layer, at least a first outer metal layer, a second metal layer, and a first inner metal layer, and
an extent of oxidation of the first outer metal layer is greater than an extent of oxidation of the second metal layer and the extent of oxidation of the second metal layer is less than an extent of oxidation of the first inner metal layer.

11. The semiconductor structure of claim 10, wherein
the first outer metal layer includes at least one of Ti, TiN, Ta, TaN, W, WN, and TiW,
the second metal layer includes at least one Au and Pd,
the first inner metal layer includes at least one of Ti, TiN, Ta, TaN, W, WN, and TiW, and
the main plug pattern includes Cu.

12. The semiconductor structure of claim 1, wherein a width of the subsidiary plug is less than or equal to a width of the recess.

13. The semiconductor structure of claim 1, wherein the subsidiary plug is a bonding pad.

14. The semiconductor structure of claim 13, wherein the subsidiary plug protrudes from an adhesive insulating layer.

15. The semiconductor structure of claim 14, further comprising:
a protection layer on an upper surface of the semiconductor chip including the penetrating hole;
a UBM layer on the main plug pattern; and
an adhesive insulating layer covering the UBM layer and the protection layer and exposing a protrusion, wherein the socket layer is connected to an I/O pad on the upper surface.

16. The semiconductor structure of claim 1, wherein the chips are electrically connected via one of the subsidiary plug pattern and the recess.

17. A package, comprising:
a plurality of semiconductor structures of claim 1, connected by their respective connecting structures.

18. A multichip package, comprising:
the semiconductor structure of claim 1, wherein
one of the semiconductor chips is an upper semiconductor chip having the recess defined by the main plug pattern; and
another of the semiconductor chips is a lower semiconductor chip having the subsidiary plug pattern enclosed by the recess.

19. The multichip package of claim 18, further comprising:
a board including a recess, the recess of the board connected to a protrusion of the upper semiconductor chip; and
a molding material, attached to the board, the molding material and the board surrounding each of the semiconductor chips.

20. The semiconductor structure of claim 16, wherein the subsidiary plug pattern and the socket pattern in the recess form an intermetallic bond.

21. The semiconductor structure of claim 20, wherein the intermetallic bond anchors one of the semiconductor chips to another of the semiconductor chips.

22. The semiconductor structure of claim 21, wherein the subsidiary plug pattern is made of a low melting point metal and a portion of the socket pattern in the recess includes at least one of gold and palladium.

* * * * *